United States Patent [19]

Hirofumi et al.

[11] 4,383,017

[45] May 10, 1983

[54] MANUFACTURING METHOD OF STRIPE FILTER

[75] Inventors: Shimizu Hirofumi; Yamano Akira; Ikeuchi Shinzo, all of Kyoto, Japan

[73] Assignee: Dainippon Screen Mfg., Ltd., Kyoto, Japan

[21] Appl. No.: 279,674

[22] Filed: Jul. 1, 1981

[30] Foreign Application Priority Data

Jul. 3, 1980 [JP] Japan ................................ 55-92153
Oct. 29, 1980 [JP] Japan ............................... 55-152784

[51] Int. Cl.³ .................................................. G03C 5/00
[52] U.S. Cl. ...................................... 430/7; 430/293; 430/294
[58] Field of Search ......................... 430/7, 293, 294

[56] References Cited

U.S. PATENT DOCUMENTS

| | | | |
|---|---|---|---|
| 1,805,361 | 5/1931 | Dufay | 430/7 |
| 2,007,282 | 7/1935 | Muller | 430/7 |
| 3,130,050 | 4/1964 | Schwerin | 430/294 |
| 3,258,337 | 6/1966 | Cousins | 430/294 |
| 3,623,880 | 11/1971 | Sannella et al. | 430/294 |
| 3,954,468 | 5/1976 | Lewis et al. | 430/294 |
| 4,311,773 | 1/1982 | Kaneko et al. | 430/7 |

FOREIGN PATENT DOCUMENTS 52-17375 5/1977 Japan .

OTHER PUBLICATIONS

Research Disclosure, Item No. 19420, Jun. 1980.

Primary Examiner—J. Travis Brown
Attorney, Agent, or Firm—Brumbaugh, Graves, Donohue & Raymond

[57] ABSTRACT

A method of manufacturing a stripe filter for optical usages, the method being based on a partially hardening of a liquid colored composition spread on a transparent base plate together with a partially eliminating of portions remaining soluble after the hardening operation, wherein a series of these operations is repeated with said compositions respectively assuming different colors.

10 Claims, 11 Drawing Figures

MANUFACTURING METHOD OF STRIPE FILTER

BACKGROUND OF THE INVENTION

The invention relates to a method of manufacturing a stripe filter for optical usages, in particular in the television cameras.

The stripe filter has a transparent colorless plate such as a glass plate which is covered with fine parallel or crossed stripes assuming different colors. The stripes are about 10 μm wide or wider, and are arranged regularly as to their colors. Therefore, a transparent film formed from a hardenable composition on the surface of the plate has been repeatedly subjected to a partially dyeing treatment to constitute the regularly arranged stripes.

In case that the whole area of the film is dyed at once, a partially decolorizing treatment has been repeatedly carried out. In these conventional methods, protecting layers having a predetermined pattern of slots must be formed each time of said partially dyeing or partially decolorizing for the purpose of preventing the dye or decolorizer from acting on the undesirable zones of the film. The necessity of such protecting layer has made the manufacture of stripe filter much complicated, and said layer was not sufficiently effective to avoid contamination of the side portions of the stripes already dyed. Thus, there have been various difficulties in the control of dyeing processes, the selection of dyestuffs and the assurance of exactitude in the quality of products. There was a possibility that the residual amount of the above-mentioned decolorizer, when used, and the decomposed dyestuff should change the spectra of fine colored stripes in course of time. In addition, it was an another serious drawback that the portions of said transparent film were apt to be dyed to uneven depth or richness of color.

BRIEF SUMMARY OF THE INVENTION

An object of the present invention is to provide with a novel method for manufacturing stripe filters by using liquid compositions previously colored with dyestuff or pigment.

Another object of the invention is to provide with a novel method for manufacturing stripe filters in which a layer of previously colored composition on a transparent plate is partially made unsoluble and partially dissolved off thereafter from said plate.

A still another object of the invention is to provide with a manufacturing method for stripe filters wherein unit operations or steps are more easily repeated in sequence, the steps including an application of liquid colored composition onto a transparent plate, drying the composition for forming a solid layer or film, making unsoluble the predetermined portions of layer according to a desired pattern, and dissolving off the soluble portions of the layer.

Further object of the invention is to manufacture stripe filters of higher quality under higher yield.

Still further object will become apparent in the course of the following detailed description.

BRIEF DESCRIPTION OF THE DRAWINGS

In order to facilitate an understanding of this invention, some preferred embodiments, which are not limitative but modifiable, will now be described with reference to the accompanying drawings in which.

DETAILED DESCRIPTION OF THE INVENTION

Figure 1:
FIG. 1 to FIG. 7 are diagrammatical sections sequencially shown in manufacturing course of a stripe filter according to the first, the second or the fourth embodiment.

In the present invention, colored liquid compositions are used which can be solidified and made unsoluble by irradiation of light, particularly of the ultraviolet rays. The compositions are colored to any desired tints before application. Each of the compositions may be solution, mixture, emulsion or the like. When said compositions are applied on such a transparent base plate as a glass plate, they can dissolve into a suitable solvent before they are hardened, but they can no more dissolve into the same solvent after hardening. As the result, the hardened compositions firmly stick to the surface of said plate.

In order to manufacture the above-identified stripe filters with said colored compositions, a sequential set of operations is repeated two or more times. The set of operations comprises coating the base plate with a colored composition of a required tint, drying the liquid composition to form a film on said plate, exposure of striped zones of said film to a suitable ray of light for hardening said zones, dissolving the unhardened zones of above film for removal thereof from the plate and recoating the plate with another colored composition having a different tint or tinge from that of above-mentioned composition. If necessary, an intermediate layer or film may be formed before the recoating, thereby the layer acting as a barrier against an undesired permeation of dye molecules into the zones already hardened.

The above-mentioned colored liquid comprises a high-polymeric material (called hereinafter "a coating material") as a principal ingredient in forming a film on the base plate. The liquid composition further comprises a solvent or dispersing medium for said coating material and a photosensitive hardener therefor. Moreover, the composition contains therein a coloring agent such as dyestuff or pigment and an accelerator which is optionally added to accelerate the dissolution of dyestuff when the same is selected as the coloring agent. Each of the foregoing ingredients may be dissolved in the solvent or dispersed therein to give a homogenous suspension or emulsion.

In case that said polymeric coating material is a hydrophilic one such as a kind of gelatins, glues or the likes, the solvent therefor being water, it is desirable to select a hydrophilic dyestuff. In case that the coating material is such as a lipophilic one as a cyclized rubber having a cyclic structure in molecule, an organic solvent such as xylene is suitable and disperse dyes, oil soluble dyes or sufficiently fine pigments are available. The diameter of the pigment is, desirably, 0.1 μm or less since the thickness of the tinted stripes on the base plate of glass is generally lees than 10 μm.

The photo-sensitive hardener is a compound which is activated by absorption of the ultraviolet rays so that it changes into an ion or a radical. The ions or radicals of the hardener molecules react with the molecules of coating material, or accelerate the reaction among the latter molecules. When a gelatin is used as the coating material, a bichromate is one of suitable hardeners. In this case, an ion containing an chromium atom of hexavalence (i.e. (VI)Cr) probably changes into the other ion containing trivalent chromium by irradiation of the ultraviolet ray, and the latter ion makes cross linkages between the gelatin molecules, thereby forming an unsoluble gel having a network structure.

Diazido compounds having two azido groups per molecule are suitable hardeners for the cyclized rubber mentioned above.

Exemplary accelerators, which may be optionally added into the liquid compositions colored with dyestuffs, are: urea, derivatives of urea, thiourea, derivatives of thiourea, ethylene glycol, polyethylene glycol or its derivatives, thiodiethylene glycol, glycerin, and sorbitol or other polyhydric alcohols. Any one of these accelerators, or otherwise a mixture of two or more thereof, can be used for accelerating the dissolution of acid dyes, basic dyes or reactive dyes, approximately in the ratio of one of the former to ten of the latter(s) by weight or at least in the ratio 1:100.

It will be appreciated that in the present invention the step for applying and drying the liquid colored composition on the base plate surface, the step for partially hardening the composition and the step for eliminating the unhardened soluble portions from said plate are repeated in sequence and for the desired number of times. Concrete means practically adopted in said steps will be explained hereinafter. In order to apply the composition onto the base plate, the so-called dipping technique, the so-called spinner technique and other proper technique are available. In the dipping technique, the plate will be steeped in the colored composition liquid. If the spinner technique is alternatively chosen, the plate will be rotated in a horizontal plane and with a high speed, so that the liquid fed at the center of said plate may be spread over the whole surface due to the centrifugal force.

For hardening and making unsoluble the restricted fine regions of the film of the colored composition thus formed on the plate, it is necessary to expose the regions to the ultraviolet rays. Such a partial exposure is achieved by means of a "photo-mask" which is hereinafter called merely "mask" and which comprises shading zones formed on a transparent sheet, each two of the shading zones being spaced apart from each other with a transmitting zone interposed between them. The ultraviolet rays is irradiated for a predetermined period into said film through the transmitting zones of the mask, which mask is then removed away from its position for the purpose of dissolving off unexposed regions from the plate with an adequate solvent such as the water. A preparatory treatment including drying of the plate may be carried out before the next application of the colored composition of a different color. It is desirable, as the case may be, to form an intermediate layer for avoiding the inconvenience hereinafter described.

It will be apparent from the foregoing description that the ingredients and the preparation of the liquid colored compositions play important rolls in the invented method. Consequently, some additional explanations will be given hereinafter.

The inventors have sometimes observed in their study a so-called "migration" phenomenon, that is, they found that a relatively small amount of dyestuff tended to dissolve from the hardened regions of the film into the solvent during the process for eliminating the unhardened regions aforedescribed. In that event, it is impossible or extremely difficult to keep a required depth of color in the hardened regions remaining unsolved on the base depth. They have found the aforementioned accelerator to be an efficient means for avoiding the migration problem which is possibly related to an extraordinarily high concentration of the dyestuff in the liquid colored composition. Due to the peculiarity in the uses of the stripe filters, the ratio of dyestuff amount to the dry weight of the coating material is much higher than the same in the dyeing of textile goods.

The dissolution accelerator aforedescribed is seemed to have not only an effect of accelerating the dissolving of the dyestuff but also an effect of swelling the coating material. The coating material molecules will probably be so extended by the accelerator that they may tangle with one another to absorb more dyestuff molecules fixedly on their network configuration developed by the swelling effect of the accelerator. Thus, the liquid colored composition has an increased dyestuff concentration which will be kept as it is even after the application and drying on the glass plate. In other words, the coated film will obtain a desired high concentration of the dyestuff, and the latter will not migrate into the developer solvent used for eliminating the unexposed regions of said film on said plate.

Furthermore, it has been found that the accelerator provides an especially remarkable effect when utilized for forcibly dissolving a dyestuff which should otherwise be difficult to dissolve to such a high concentration. Ageing of the colored composition at about room temperature or a little higher temperature, for instance, at 40° C. to 60° C. for a few hours or days has also proved efficient in preventing the migration under cirtain circumstances and for certain kinds of dyestuffs, as will be described hereinafter.

The method for manufacturing the stripe filters in accordance with this invention is also applicable for manufacturing filters used for various purposes as well as for manufacturing the filters of television cameras. On these filters, regions having different colors may constitute various patterns including a checkered one, a mosaic one or other else besides the zonal patterns in which the differently colored rectilineal zones or regions are in parallel to each other or crossing each other. In the television camera's filter, three groups of regions having different colors are generally arranged alternatively and in parallel to one another, said colors being a series of primary colors i.e. red, green and blue, a series of cyanic, green and light magenta or a series of cyanic, green and transparently colorless. Said regions of the film on the glass plate in general 1 to 2 μm thick and 10 to 30 μm wide. The colors of the regions may of course be different from those aforementioned. It is also possible to cross the cyanic stripes and yellow stripes in order to provide rectangular fine regions of these two colors and regions of a greenish color brought about through a mixing of said cyanic color and yellow.

It will now be apparent that the method of the invention is based on the spreading or application of the pre-colored composition and the partially removing of it thereafter. Consequently excluded are many troublesome operation such as the partially dyeing and partially decolorizing of the thin film on the base plate, the frequently forming and elimination of the barrier layer, etc. Thus, many drawbacks in the prior arts are solved in such a manner that any excessively precise carefulness may not be needed in the selection of dyestuffs as well as in the control of dyeing conditions. Each of the different colored stripes will obtain and keep its desired spectrum character since it is not contaminated with the successively applied colored composition. There is, furthermore, no possibility that the spectra of the colored stripes will be changed in course of time since no decolorizer such as an oxidizer or reducing agent is involved into the method according to the invention.

As a still further merit of the method, any unevenness in dyeing or decolorization unavoidable in the prior arts is not encountered, thereby remarkably improving the quality and yield of the stripe filters.

As described above, when a proper dissolution accelerator is selected in case of using a dyestuff as the coloring agent, the migration or contamination problem caused by or relating to the dyestuff is avoided during the series of operations, especially in the eliminating of the unhardened regions and in the re-application thereafter of the other colored composition.

It is a further merit of this invention that an optimum coloring agent can be selected from a wider range of sames including said pigments so as to improve the quality and yield of stripe filters by taking into account the durability of the agent, the tint of color and so on.

FIRST EMBODIMENT

A gelatin is selected as a coating material to be dissolved into water with an appropriate amount of a bichromate salt as a hardener. The dissolving operation is performed in a plate where the ultraviolet rays are intercepted, for instance, within a darkroom. The thus prepared solution is divided into three parts so as to make three kinds of liquid compositions of optical primary colors. Namely, added respectively into each of said parts is one of the following acid dyes, and is further dissolved.

(1) A red dye for a colored composition R:
   Suminol Milling Red RS (a product by SUMITOMO KAGAKU KOGYO CO., LTD.).
(2) A green dye for a colored composition G:
   A mixture of one part of Acid Fast Yellow MR (a product by CHUGAI KASEI CO., LTD.) and one part of Sumitomo Brilliant Blue 5G (a product by SUMITOMO KAGAKU KOGYO CO., LTD.).
(3) A blue dye for a colored composition B:
   Supranol Cyanine 6B (a product by FARBENFABRIKEN BAYER A.G.).

Concentrations of the above dyes in said compositions are determined in such a manner as each of stripes of 1 μm width may have a required spectrum character.

Figure 2:
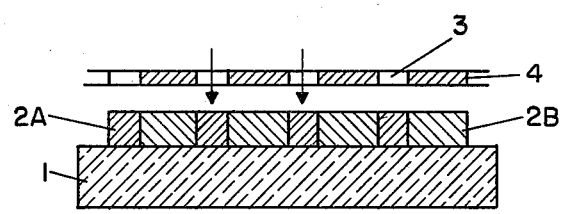
Figure 3:
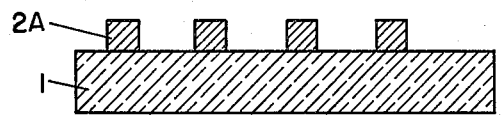

After these preparations are made, operations shown in FIG. 1 to FIG. 7 are performed in the sequence also shown in the same figures. At the first, the colored composition R indicated at the numeral 2 is applied onto one surface of a transparent glass base plate 1 to a thickness of about 1 μm by the spinner technique aforedescribed. The ultraviolet rays are then irradiated from top of the figure to a layer of said composition through a mask 4 which has transmitting zones 3 of predetermined width spaced apart each other. Portions of the layer corresponding to said transmitting zones 3 are thus hardened to form red stripes 2A (see FIG. 2). Other portions 2B of said layer are not hardened since the portions are screened from said rays. Consequently, said unhardened portions 2B are dissolved into hot water as shown in FIG. 3.

Figure 4:
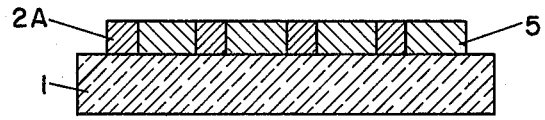
Figure 5:
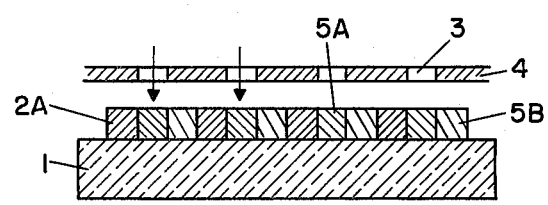
Figure 6:
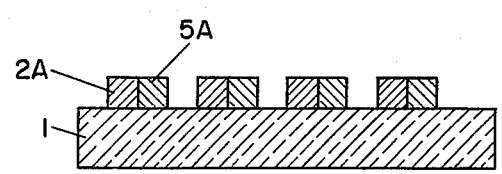

In the next place, the other colored composition indicated at 5 is similarly applied onto the surfaces of said plate and stripes (see FIG. 4 wherein, however the top surface of the red stripes 2A are sketched as being level with the surface of said composition G, in spite of an actual slight overlap of the latter on the former). The ultraviolet rays are similarly irradiated to the newly coated film through the aforementioned mask 4 which, in this step, has been horizontally shifted a distance equal to the width of the stripes as shown in FIG. 5. The rays harden also portions of the film corresponding to the transmitting zones 3 to form green stripes 5A. Unhardened portions 5B remaining soluble are then eliminated in the same manner as aforementioned, thereby resulting in a state as shown in FIG. 6.

Figure 7:
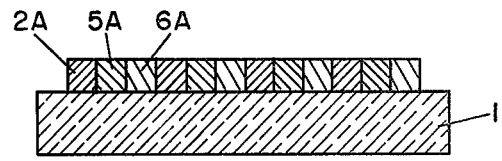
Figure 8:
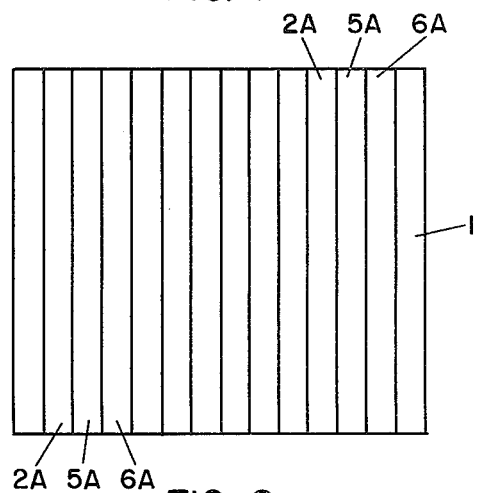
FIG. 8 is a diagrammatical plane view of a finished stripe filter in accordance with any one of said three embodiments.

Further, the colored composition B is applied and partially hardened in the same manner to form blue stripes 6B in blank spaces between the stripes already formed. The state is shown in FIG. 7 and FIG. 8. It will be found that these stripes were arranged in parallel to each other and in a mutually adjoining state.

SECOND EMBODIMENT

A so-called "photo-resist" OMR 83 (a product by TOKYO OHKA CO., LTD.) which is a lipophilic liquid and contains a cyclyzed rubber as a coating material and a diazido compound as a photo-sensitive hardener, is utilized for preparations of colored compositions R, G and B the colors of which are respectively red, green and blue. The coloring agents used in said preparations are the following oil-soluble dyes assuming respectively the three optical primary colors.

(1) An oil-soluble red dye for the composition R:
   Solden Red 3R (a product by CHUGAI KASEI CO., LTD.).
(2) An oil-soluble green dye for the composition G:
   Sumiplast Green G (a product by SUMITOMO KAGAKU KOGYO CO., LTD.).
(3) An oil-soluble blue dye for the composition B:
   (Victoria Blue F4R (a product by BADISCHE ANILIN UND SODA FABLIK A.G.).

Operations are performed in the same manner as in the aforedescribed First Embodiment except that the portions remaining unhardened after the ultraviolet rays irradiation are dissolved off with an organic solvent. A similar stripe filter as is shown in the aforementioned figures was manufactured with success.

THIRD EMBODIMENT

Figure 9:
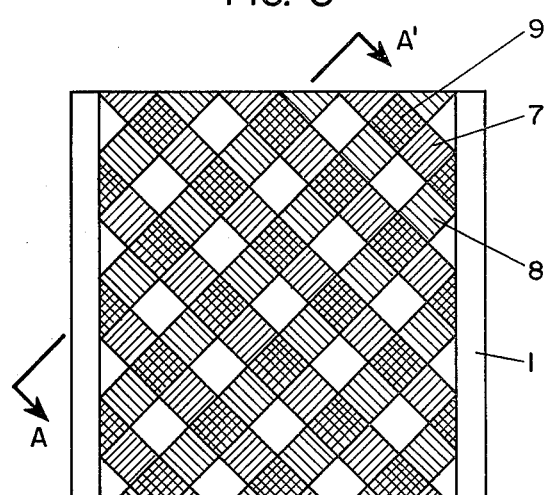
FIG. 9 is a diagrammatical plan view of another finished stripe filter in accordance with any one of the third and the fifth embodiments.
Figure 10:
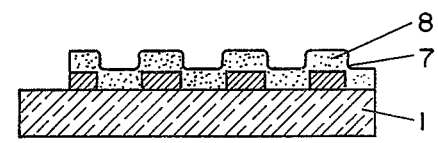
FIG. 10 is a section taken along the A—A' line in FIG. 9.

This embodiment represents a method for manufacturing another kind of stripe filter which consists of some groups, in particular, two groups of stripes respectively having their colors, the colors making another desirable mixed color where the stripes lie one upon another (as shown in FIG. 9 and FIG. 10). Namely the two groups of stripes on a transparent base plate are here arranged to cross each other with a predetermined degree of angle on the contrary to the foregoing stripe filters having three groups of stripes arranged in parallel. Said two groups 7, 8 respectively having a "cyanic" color and a yellow color provide with a mixed color thereof at overlying portions 9.

Necessary operations and preparations are similar to that in the foregoing embodiments except for said overlying structure and a mask used in a partial exposure to the ultraviolet rays. A gelatin is also chosen as a coating material to be dissolved into water together with an appropriate amount of ammonium bichromate as a hardener. In order to prepare liquid compositions of cyanic color C and same of yellow Y, the following acid dyes are added and dissolved into the gelatin solutions.

(1) A cyanic dye for the colored composition C: Solar Cyanine 6B conc. (a product by SUMITOMO KAGAKU KOGYO CO., LTD.).

(2) A yellow dye for the colored composition Y: Suminol Fast Yellow R (a product by ibid.).

It should be noted that, in all the above embodiments including the Third Embodiment, stripe filters of good quality have been efficiently produced under higher yield.

It should be also noted that such lipophilic colored compositions as in the Second Embodiment can be, in one series of operations, utilized together with such hydrophilic compositions as in the First and Third Embodiment.

FOURTH EMBODIMENT

A gelatin is, also in this case, used as a coating material for the preparations of the following three colored compositions, said colors being optical primary ones, wherein said gelatin, an appropriate amount of ammonium bichromate (hardener), acid dyes and dissolution accelerators are carefully dissolved within, for instance, a darkroom to avoid a hardening effect of the ultraviolet rays.

(1) Ingredients of a composition R (red):
Suminol Milling Red RS (an acid dye produced by SUMITOMO KAGAKU KOGYO CO., LTD.). 3% urea, (accelerator) 0.2%, gelatin 8%, ammonium bichromate 1% and water 87.8%.

(2) Ingredients of a composition G (green):
an admixture of the same parts of Acid Fast Yellow MR (an acid dye produced by CHUGAI KASEI CO., LTD.) and Sumitomo Brilliant Blue 5G (an acid dye produced by SUMITOMO KAGAKU KOGYO CO., LTD.) 4%, polyethylene glycol (accelerator) 0.4%, gelatin 9%, ammonium bichromate 1.2% and water 85.4%.

(3) Ingredients of a composition B (blue):
Supranol Cyanine 6B (an acid dye produced by FARBENFABRIKEN BAYER A.G.) 3.5%, glycerin (accelerator) 0.3%, gelatin 8%, ammonium bichromate 1% and water 85.4%.

All the above percentages are based on the weights. After the above compositions being dissolved by a strong agitation, they were ripened or aged for a day and night at about 50° C. With the thus prepared liquid colored compositions, operations are carried out in the order illustrated in FIG. 1 to FIG. 7.

At the first, the composition R indicated at 2 is applied on a transparent glass plate 1 and then partially hardened to form red stripes 2A as illustrated in FIG. 1 and FIG. 2.

Unhardened portions were dissolved off with hot water at about 50° C. as in FIG. 3 wherein an amount of the dye dissolved out of the stripes 2A was almost a negligible quantity.

It may be useful to form an intermediate layer on the surface of said stripes and plate in order to protect said stripes from contamination with a dye in the other composition applied in the next step. Said measures for contamination control will satisfy a demand for a stripe filter of the highest grade in quality. The intermediate layer will be, for example, made from a transparent solution of such a synthetic resin as acrylic resin or polyurethane. It is convenient to apply the solution to about 1 μm thick and dry it for about 5 minutes at 80° C. or so.

The second composition G indicated at 5 is then spread over said surface and consequently hardened in part to provide green stripes 5A in accordance with FIG. 4 and FIG. 5. FIG. 6 similary illustrates the state which appears after unhardened portions 5B being eliminated. The dye molecules were also substantially prevented from dissolving out of the stripes 5A even though which had not been covered with said layer. It is possible, of course, to incorporate said layer, if necessary.

At the last, the composition B is applied in a similar manner to be partially hardened for forming blue stripes 6B in the blank space between the sames constituted in the preceding steps. FIG. 7 and FIG. 8 illustrate the stripes of three different colors close and in parallel to each other.

FIFTH EMBODIMENT

Two groups of differently colored stripes are crossed each other to give a mixed color to overlying square portions like those in the Third Embodiment.

Ingredients of colored compositions are as follows.

(1) Ingredients of a composition Y (yellow):
Aminyl Yello E-5GN (an acid dye produced by SUMITOMO KAGAKU KOGYO CO., LTD.) 3%, urea (accelerator) 0.2%, gelatin 8%, ammonium bichromate 1% and water 87.8%.

(2) Ingredients of a composition C (cyanic):
Sumifix Turquoise Blue H-GF (a reactive dye produced by ibid.) 4%, thiodiethylene glycol (accelerator) 0.1%, gelatin 10%, ammonium bichromate 1.5% and water 84.4%.

All the above percentages are based on the weights. Said compositions are ripened in the same condition as that in the Fourth Embodiment.

Figure 11:
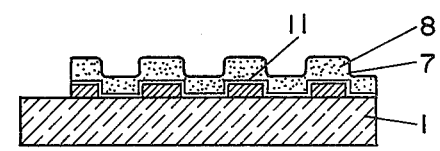
FIG. 11 is a similar sectional view of a stripe filter in which an intermediate layer is incorporated in the fifth embodiment.

Operations are also similar to those of the preceding Third Embodiment. A transparent intermediate layer 11 (FIG. 11) can be useful under certain circumstances.

FIG. 9 and FIG. 10 diagrammatically show the structure of the thus obtained filter in which cyanic stripes 8 overlie yellow stripes 8 at the portions 9 assuming a green color caused by a mixing of the former two colors. By the method described in the Fourth and Fifth Embodiment, the stripe filters can be manufactured with a higher yield of excellent products as well as with an increased efficiency owing especially to a perfect avoidance of the aforedescribed migration phenomenon by making use of the accelerators.

What is claimed is:

1. A method of manufacturing a stripe filter having a transparent base plate and fine stripes formed thereon and assuming different colors, said method comprising a repeated series of operations including (a) applying onto and drying on the base plate a liquid colored composition which contains at least a dyestuff assuming a predetermined color, a coating material, a dissolution accelerator for the dyestuff and a photo-sensitive hardener therefor, (b) exposing predetermined portions of said composition on the plate by means of a mask having a predetermined pattern of transmitting zones in such a degree as to harden said portions, thereby forming a group of unsoluble stripes assuming said predetermined color, (c) eliminating other portions remaining unhardened by means of a solvent for said coating material, thereby said unhardened portions being dissolved into said solvent, and repeating the series of operations for required times, each time using a different liquid composition assuming a different color being used and the number of times being determined in accordance with the number of said groups.

2. A method of manufacturing a stripe filter according to claim 1, wherein each of said compositions assumes respectively one of three optical primary colors, and said repetition number is set three for arranging said stripes in parallel with and close to each other.

3. A method of manufacturing a stripe filter according to claim 1, wherein each of said compositions assumes respectively one of two colors which are mixed to assume another predetermined color, and said repetition number is set two for crossing said stripes each other.

4. A method of manufacturing a stripe filter according to claim 1, wherein a transparent intermediate layer is interposed between the groups of said stripes.

5. A method of manufacturing a stripe filter according to claim 4, wherein said stripes assuming different colors are arranged in parallel with and close to each other.

6. A method of manufacturing a stripe filter according to claim 4, wherein two groups of said stripes assuming different colors are crossed each other to assume another predetermined color at crossing portions.

7. A method of manufacturing a stripe filter according to claim 5, wherein said colors are red, blue and green which correspond to the three optical primary colors.

8. A method of manufacturing a stripe filter according to claim 5, wherein said colors are cyanic, green and magenta.

9. A method of manufacturing a stripe filter according to claim 5, wherein said colors are cyanic, green and colorless.

10. A method of manufacturing a stripe filter according to claim 6, wherein said colors are cyanic and yellow.

* * * * *